United States Patent
Song et al.

(10) Patent No.: US 12,451,372 B2
(45) Date of Patent: Oct. 21, 2025

(54) FILLER MEMBER AND SUBSTRATE TREATING APPARATUS

(71) Applicant: SEMES CO., LTD., Cheonan-si (KR)

(72) Inventors: Ju Yeon Song, Sokcho-si (KR); Sang Min Lee, Seoul (KR)

(73) Assignee: Semes Co., LTD., Chungcheongnam-do (KR)

( * ) Notice: Subject to any disclaimer, the term of this patent is extended or adjusted under 35 U.S.C. 154(b) by 0 days.

(21) Appl. No.: 18/926,562

(22) Filed: Oct. 25, 2024

(65) Prior Publication Data
US 2025/0140577 A1 May 1, 2025

(30) Foreign Application Priority Data
Oct. 26, 2023 (KR) .......................... 10-2023-0144942

(51) Int. Cl.
*H01L 21/67* (2006.01)

(52) U.S. Cl.
CPC .. *H01L 21/67034* (2013.01); *H01L 21/67051* (2013.01); *H01L 21/6719* (2013.01)

(58) Field of Classification Search
CPC ............. H01L 21/6719; H01L 21/6875; H01L 21/68714; H01L 21/6708; H01L 21/67103; H01L 21/67034; B08B 3/04; B08B 13/00
See application file for complete search history.

(56) References Cited

U.S. PATENT DOCUMENTS

| | | | |
|---|---|---|---|
| 6,312,518 B1* | 11/2001 | Kwon | G03F 7/168 118/69 |
| 7,513,265 B2* | 4/2009 | Yoshikawa | H01L 21/67017 134/33 |
| 2015/0155188 A1* | 6/2015 | Jung | H01L 21/67051 34/558 |
| 2018/0190485 A1* | 7/2018 | Jang | H01L 21/67103 |
| 2018/0358242 A1* | 12/2018 | Kim | H01L 21/67126 |
| 2019/0164787 A1* | 5/2019 | Lee | H01L 21/6715 |

FOREIGN PATENT DOCUMENTS

| | | |
|---|---|---|
| KR | 10-2001-0033394 A | 4/2001 |
| KR | 10-2013-0063813 A | 6/2013 |
| KR | 10-2019-0001222 A | 1/2019 |
| KR | 10-2022-0089821 A | 6/2022 |

OTHER PUBLICATIONS

Machine Translation of KR 1020190001222 to Kim, Jan. 2019. (Year: 2019).*

* cited by examiner

Primary Examiner — Benjamin L Osterhout
(74) Attorney, Agent, or Firm — Harness, Dickey & Pierce, P.L.C.

(57) ABSTRACT

Disclosed is a substrate treating apparatus including: a chamber providing a treatment space therein; a substrate support member located inside the chamber and for supporting a substrate; a supply port for supplying a treatment fluid into the treatment space of the chamber; a filler member located between the supply port and the substrate to fill a portion of a volume of the treatment space, in which the filler member has perforations, and the perforations are provided in a collision shape such that treatment fluids passing through the perforations collide each other.

12 Claims, 13 Drawing Sheets

(A)         (B)         (C)         (D)

FILLER MEMBER AND SUBSTRATE TREATING APPARATUS

CROSS-REFERENCE TO RELATED APPLICATIONS

This application claims priority to and the benefit of Korean Patent Application No. 10-2023-0144942 filed in the Korean Intellectual Property Office on Oct. 26, 2023, the entire contents of which are incorporated herein by reference.

TECHNICAL FIELD

The present invention provides a substrate treating apparatus and a filler member provided therein.

BACKGROUND ART

In order to manufacture a semiconductor device, a desired pattern is formed on a substrate, such as a wafer, through various processes, such as photography, etching, ashing, ion implantation, and thin film deposition. Various treatment solutions and treatment gas are used in each process, and particles and process by-products are generated during the process. Cleaning processes are performed before and after each process to remove these particles and process by-products from the substrate.

A typical cleaning process involves treating the substrate with chemicals and rinse solutions, followed by drying. One example of a drying treatment is a rotary drying process in which the substrate is rotated at high speeds to remove any residual rinse solution from the substrate. However, the foregoing rotary drying method may disrupt the pattern formed on the substrate.

Recently, a supercritical drying process has been utilized in which the residual rinse solution on the substrate is replaced with an organic solvent, such as isopropyl alcohol (IPA), which has a low surface tension, by supplying the organic solvent on the substrate and the substrate is then supplied with supercritical drying gas (for example, carbon dioxide) to remove the residual organic solvent from the substrate. In the supercritical drying process, the drying gas is supplied to a process chamber with the sealed interior, and the drying gas is heated and pressurized. As a result, both the temperature and pressure of the drying gas rise to the critical point or higher, and the drying gas undergoes a phase change to a supercritical state.

In a substrate treating apparatus that performs a supercritical drying process, an upper body and a lower body are combined with each other to form an inner space, and in a state where a substrate, such as a wafer, is supported by a support member in the inner space, the pressure of the inner space is maintained at a high pressure, and drying gas is supplied to dry the substrate.

The substrate treating apparatus that performs the supercritical drying process has a filler member installed in the inner space, and the filler member is a simple plate shape, which has limitations in increasing the turbulence intensity of the drying gas.

SUMMARY OF THE INVENTION

The present invention has been made in an effort to provide a substrate treating apparatus capable of increasing efficiency of disposition of a residual fluid on a substrate by increasing turbulence intensity of a treatment fluid supplied to a treatment space, and a filler member provided therein.

The present invention has also been made in an effort to provide a substrate treating apparatus capable of increasing efficiency of atomization of a treatment fluid by inducing collision of the treatment fluid, and a filler member provided therein.

The problem to be solved by the present invention is not limited to the above-mentioned problems, and the problems not mentioned will be clearly understood by those skilled in the art from the descriptions below.

An exemplary embodiment of the present invention provides a substrate treating apparatus including: a chamber providing a treatment space therein; a substrate support member located inside the chamber and for supporting a substrate; a supply port for supplying a treatment fluid into the treatment space of the chamber; a filler member located between the supply port and the substrate to fill a portion of a volume of the treatment space, in which the filler member has perforations, and the perforations are provided in a collision shape such that treatment fluids passing through the perforations collide each other.

Further, the filler member may include a plate having a plurality of perforation groups, and the perforation group may be provided such that the perforations have collision points where discharge paths of the treatment fluids intersect.

Further, at least one of the perforations configuring the perforation group may be provided to be inclined.

Further, the perforations configuring the perforation group may be disposed in a straight line.

Further, the perforations configuring the perforation group may be disposed on the same radius.

Further, the perforation may have a cross-section in any one of a circular shape, an oval shape, a square shape, and an irregular circular shape.

Further, the plate may be provided with a central region and an edge region surrounding the central region having different disposition densities of the perforation groups.

Further, the filler member may provide a buffer space compartmentalized from the treatment space between the supply port and the plate, and the treatment fluid supplied through the supply port may stay in the buffer space and may be then supplied to the treatment space through the perforation groups in the plate.

Further, the supply port may include: an upper supply port for supplying a treatment fluid onto a top surface of the substrate; and a lower supply port for supplying a treatment fluid onto a bottom surface of the substrate, and the filler member may be provided at least one of between the upper supply port and the substrate and between the lower supply port and the substrate.

Further, the treatment fluid may be a supercritical fluid.

Another exemplary embodiment of the present invention provides a filler member for filling a portion of a volume of a treatment space in a chamber body including a supply port supplying a treatment fluid to a sealed treatment space, the filler member including: a plate having a predetermined thickness; and a perforation group formed in the plate, in which the perforation group is provided such that turbulent is induced while the treatment fluids passing through the perforations collide each other.

Further, the perforation group may be provided such that the perforations have collision points where discharge paths of the treatment fluid intersect.

Further, at least one of the perforations configuring the perforation group may be provided to be inclined.

Further, the perforations configuring the perforation group may be disposed in a straight line.

Further, the perforations configuring the perforation group may be disposed on the same radius.

Further, the plate may be provided with a central region and an edge region surrounding the central region having different disposition densities of the perforation groups.

Further, the filler member may further include a lateral wall part extending from an edge of the plate, in which a buffer space may be provided by the lateral wall part and the plate.

Still another exemplary embodiment of the present invention provides a substrate treating apparatus including: a chamber providing a treatment space therein; a substrate support member located inside the chamber and for supporting a substrate; an upper supply port for supplying a supercritical fluid to a top surface of the substrate; a lower supply port for supplying a supercritical fluid onto a bottom surface of the substrate; and a filler member located at least one of between the upper supply port and the substrate, and between the lower supply port and the substrate to fill a portion of a volume of the treatment space, in which the filler member may include a plate having perforations, and the perforations are provided to have collision points where fluid discharge paths of the perforations intersect so that the supercritical fluids passing through the perforations generates turbulence.

Further, at least one of the perforations configuring the perforation group may be provided to be inclined, and the perforations configuring the perforation group may be disposed in a straight line or on the same radius.

Further, the plate may be provided with a central region and an edge region surrounding the central region having different disposition densities of the perforation groups, the filler member may provide a buffer space compartmentalized from the treatment space between the supply port and the plate, and the treatment fluid supplied through the supply port may stay in the buffer space and is then supplied to the treatment space through the perforation groups in the plate.

According to the exemplary embodiment of the present invention, the substrate may be uniformly dried by inducing collisions of the treatment fluid supplied to the treatment space to increase the turbulence intensity of the treatment fluid, thereby increasing the efficiency of displacement with residual fluid on the surface of the substrate.

The effect of the present invention is not limited to the foregoing effects, and non-mentioned effects will be clearly understood by those skilled in the art from the present specification and the accompanying drawings.

DETAILED DESCRIPTION

Figure 1:
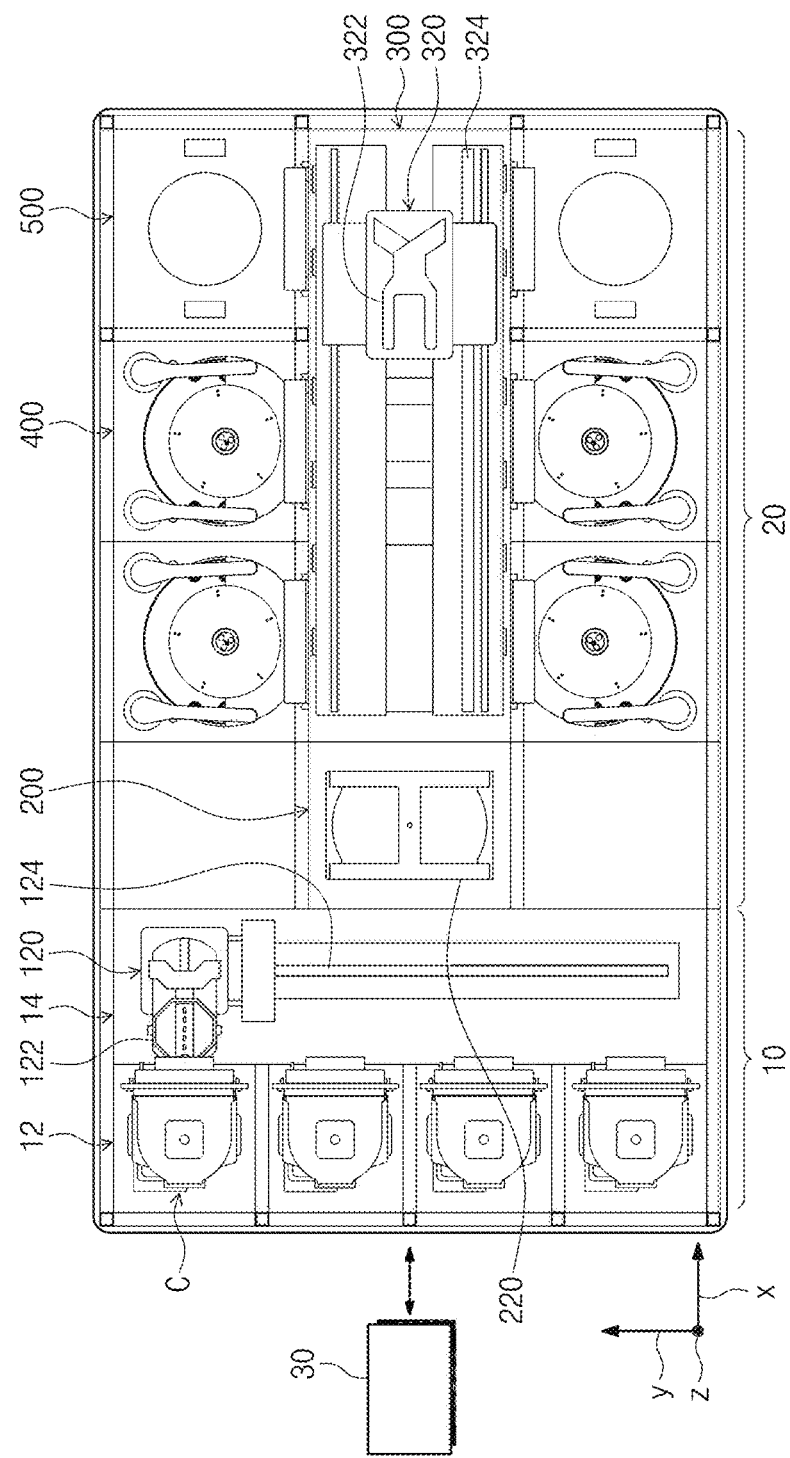
FIG. 1 is a diagram illustrating a substrate treating apparatus according to an exemplary embodiment of the present invention.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, an exemplary embodiment of the present invention will be described in detail with reference to FIGS. 1 to 15.

FIG. 1 is a diagram illustrating a substrate treating apparatus according to an exemplary embodiment of the present invention.

Referring to FIG. 1, a substrate treating apparatus includes an index module 10, a treating module 20, and a controller 30. When viewed from above, the index module 10 and the treating module 20 are disposed along one direction. Hereinafter, the direction in which the index module 10 and the treating module 20 are arranged is referred to as a first direction X, when viewed from above, a direction perpendicular to the first direction X is referred to as a second direction Y, and a direction perpendicular to both the first direction X and the second direction Y is referred to as a third direction Z.

The index module 10 transfers the substrate W from the container C in which the substrate W is accommodated to the treating module 20, and accommodates the substrate W that has been completely treated in the treating module 20 in the container C. A longitudinal direction of the index module 10 is provided in the second direction Y. The index module 10 includes a load port 12 and an index frame 14. Based on the index frame 14, the load port 12 is located at a side opposite to the treating module 20. The container C in which the substrates W are accommodated is placed in the load port 12. A plurality of load ports 12 may be provided, and the plurality of load ports 12 may be disposed along the second direction Y.

As the container C, an airtight container, such as a Front Open Unified Pod (FOUP), may be used. The container C may be placed on the load port 12 by a transport means (not illustrated), such as an overhead transfer, an overhead conveyor, or an automatic guided vehicle, or an operator.

An index robot 120 is provided to the index frame 14. A guide rail 124 of which a longitudinal direction is provided in the second direction Y is provided in the index frame 14, and the index robot 120 may be provided to be movable on the guide rail 124. The index robot 120 includes a hand 122 on which the substrate W is placed, and the hand 122 may be provided to be movable forward and backward directions, rotatable about the third direction Z and movable along the third direction Z. A plurality of hands 122 are provided to be spaced apart in the vertical direction, and the hands 122 may move forward and backward independently of each other.

The controller 30 may control the substrate treating apparatus. The controller 30 may include a process controller formed of a microprocessor (computer) that executes the control of the substrate treating apparatus, a user interface formed of a keyboard in which an operator performs a command input operation or the like in order to manage the substrate treating apparatus, a display for visualizing and displaying an operation situation of the substrate treating apparatus, and the like, and a storage unit storing a control program for executing the process executed in the substrate treating apparatus under the control of the process controller or a program, that is, a treatment recipe, for executing the process in each component according to various data and treatment conditions. Further, the user interface and the storage unit may be connected to the process controller. The processing recipe may be memorized in a storage medium in the storage unit, and the storage medium may be a hard disk, and may also be a portable disk, such as a CD-ROM or a DVD, or a semiconductor memory, such as a flash memory.

The treating module 20 includes a buffer unit 200, a transfer chamber 300, a liquid treating chamber 400, and a drying chamber 500. The buffer unit 200 provides a space in which the substrate W loaded into the treating module 20 and the substrate W unloaded from the treating module 20 stay temporarily. The liquid treating chamber 400 performs a liquid treating process of treating the substrate W with a liquid by supplying a liquid onto the substrate W. The drying chamber 500 performs a drying process of removing the liquid residual on the substrate W. The transfer chamber 300 transfers the substrate W between the buffer unit 200, the liquid treating chamber 400, and the drying chamber 500.

A longitudinal direction of the transfer chamber 300 may be provided in the first direction X. The buffer unit 200 may be disposed between the index module 10 and the transfer chamber 300. The liquid treating chamber 400 and the drying chamber 500 may be disposed on the side portion of the transfer chamber 300. The liquid treating chamber 400 and the transfer chamber 300 may be disposed along the second direction Y. The drying chamber 500 and the transfer chamber 300 may be disposed along the second direction Y. The buffer unit 200 may be located at one end of the transfer chamber 300.

According to the example, the liquid treating chambers 400 are disposed on both sides of transfer chamber 300, and the drying chambers 500 are disposed on both sides of the transfer chamber 300, and the liquid treating chambers 400 may be disposed closer to the buffer unit 200 than the drying chambers 500. At one side of the transport chamber 300, the liquid treating chambers 400 may be provided in a disposition of A×B (each of A and B is 1 or a natural larger than 1) in the first direction X and the third direction Z. Further, at one side of the transfer chamber 300, the drying chambers 500 may be provided in number of C×D (each of C and D is 1 or a natural number larger than 1) in the first direction 92 and the third direction 96. Unlike the above, only the liquid treating chambers 400 may be provided on one side of the transfer chamber 300, and only the drying chambers 500 may be provided on the other side of the transfer chamber 300.

The transfer chamber 300 includes a transfer robot 320. A guide rail 324 of which a longitudinal direction is provided in the first direction X is provided in the transfer chamber 300, and the transfer robot 320 may be provided to be movable on the guide rail 324. The index robot 320 includes a hand 322 on which the substrate W is placed, and the hand 322 may be provided to be movable forward and backward directions, rotatable about the third direction Z and movable along the third direction Z. The plurality of hands 322 is provided while being spaced apart from each other in the vertical direction, and is capable of independently moving forward and backward.

The buffer unit 200 includes a plurality of buffers 220 on which the substrate W is placed. The buffers 220 may be disposed to be spaced apart from each other along the third direction Z. A front face and a rear face of the buffer unit 200 are opened. The front face is a face facing the index module 10, and the rear face is a face facing the transfer chamber 300. The index robot 120 may approach the buffer unit 200 through the front face, and the transfer robot 320 may approach the buffer unit 200 through the rear face.

Figure 2:
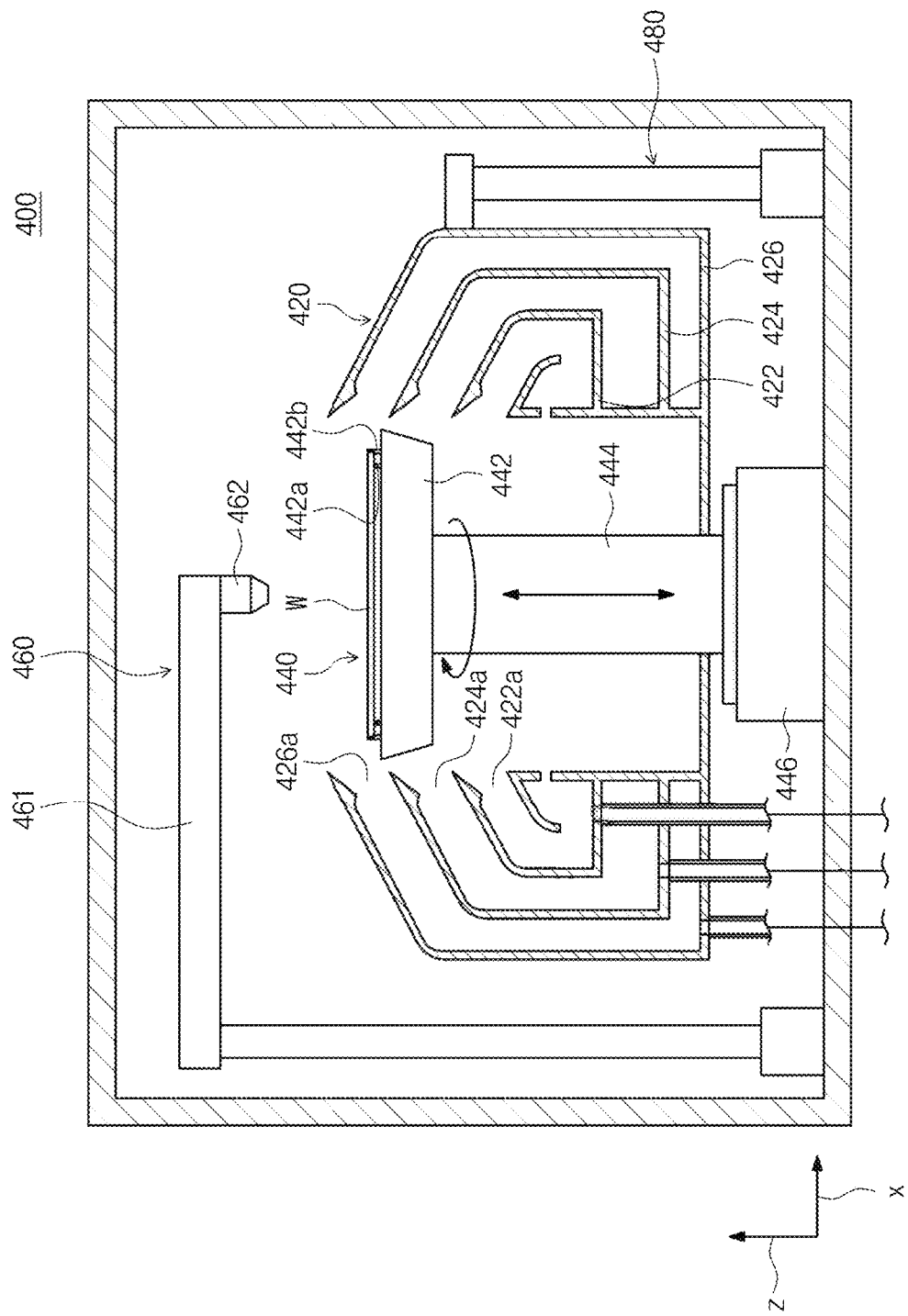
FIG. 2 is a diagram schematically illustrating a liquid treating chamber of FIG. 3 according to the exemplary embodiment.

FIG. 2 is a diagram schematically illustrating the liquid treating chamber of FIG. 1 according to an exemplary embodiment.

Referring to FIG. 2, the liquid treating chamber 400 includes a housing 410, a cup 420, a support unit 440, a liquid supply unit 460, and a lifting unit 480.

The housing 410 may have an interior space where the substrate W is processed. The housing 410 may have a generally hexahedral shape. For example, the housing 410 may have a cuboidal shape. Additionally, the housing 410 may have an opening (not illustrated) through which the substrate W is loaded or unloaded. Additionally, the housing 410 may be equipped with a door (not illustrated) that selectively opens and closes the opening.

The cup 420 may have a barrel shape with an open top. The cup 420 has a treatment space, and the substrate W may be liquid-treated within the treatment space. The support unit 440 supports the substrate W in the treatment space. The liquid supply unit 460 supplies the treatment solution onto the substrate W supported on the support unit 440. The treatment solution may be provided in a plurality of types and may be supplied sequentially onto the substrate W. The lifting unit 480 adjusts a relative height between the cup 420 and the support unit 440.

According to the example, the cup 420 includes a plurality of collection containers 422, 424, and 426. Each of the collection containers 422, 424, and 426 has a collection space of collecting the liquid used for the treating of the substrate. Each of the collection containers 422, 424, and 426 is provided in a ring shape surrounding the support unit 440. As the liquid processing process proceeds, the treatment solution scattered by the rotation of the substrate W enters the collection space through inlets 422a, 424a, and 426a of the respective collection containers 422, 424, and 426. According to the example, the cup 420 includes a first collection container 422, a second collection container 424, and a third collection container 426. The first collection container 422 is disposed to surround the support unit 440, the second collection container 424 is disposed to surround the first collection container 422, and the third collection container 426 is disposed to surround the second collection container 424. A second inlet 424a, which introduces the liquid into the second collection container 424, may be located above a first inlet 422a, which introduces the liquid into the first collection container 422, and a third inlet 426a, which introduces the liquid into the third collection container 426, may be located above the second inlet 424a.

The support unit 440 includes a support plate 442 and a driving shaft 444. A top surface of the support plate 442 may be provided in a generally circular shape, and may have a diameter larger than a diameter of the substrate W. In the center portion of the support plate 442, a support pin 442a is provided to support the rear surface of the substrate W, and the support pin 442a is provided with its upper end protruding from the support plate 442 so that the substrate W is spaced apart from the support plate 442 by a certain distance. A chuck pin 442b is provided to an edge of the support plate 442. The chuck pin 442b is provided to protrude upward from the support plate 442, and supports the lateral portion of the substrate W so that the substrate W is not separated from the support unit 440 when the substrate W is rotated. The drive shaft 444 is driven by a driver 446, is connected to the center of the bottom surface of the substrate W, and rotates the support plate 442 with respect to the central axis thereof.

In one example, the liquid supply unit 460 may include a nozzle 462. The nozzle 462 may supply the treatment liquid to the substrate W. The treatment solution may be a chemical, rinse solution, or organic solvent. The chemical may be a chemical having the nature of strong acid or strong base. In addition, the rinse solution may be pure. Furthermore, the organic solvent may be isopropyl alcohol (IPA). Additionally, the liquid supply unit 460 may include a plurality of nozzles 462, each of which may supply a different type of treatment liquid. For example, one of the nozzles 462 may supply a chemical, another of the nozzles 462 may supply a rinse solution, and yet another of the nozzles 462 may supply an organic solvent. Further, the controller 30 may control the liquid supply unit 460 to supply an organic solvent from another one of the nozzles 462 to the substrate W after supplying a rinse solution from the other one of the nozzles 462. Thus, the rinse liquid supplied to the substrate W may be replaced with an organic solvent having low surface tension.

The lifting unit 480 moves the cup 420 in the vertical direction. By the vertical movement of the cup 420, a relative height between the cup 420 and the substrate W is changed. Accordingly, since the collection containers 422, 424, and 426 for collecting the treatment solution are changed according to the type of the liquid supplied to the substrate W, the liquids may be separated and collected. Unlike the description, the cup 420 may be fixedly installed, and the lifting unit 480 may move the support unit 440 in the vertical direction.

Figure 3:
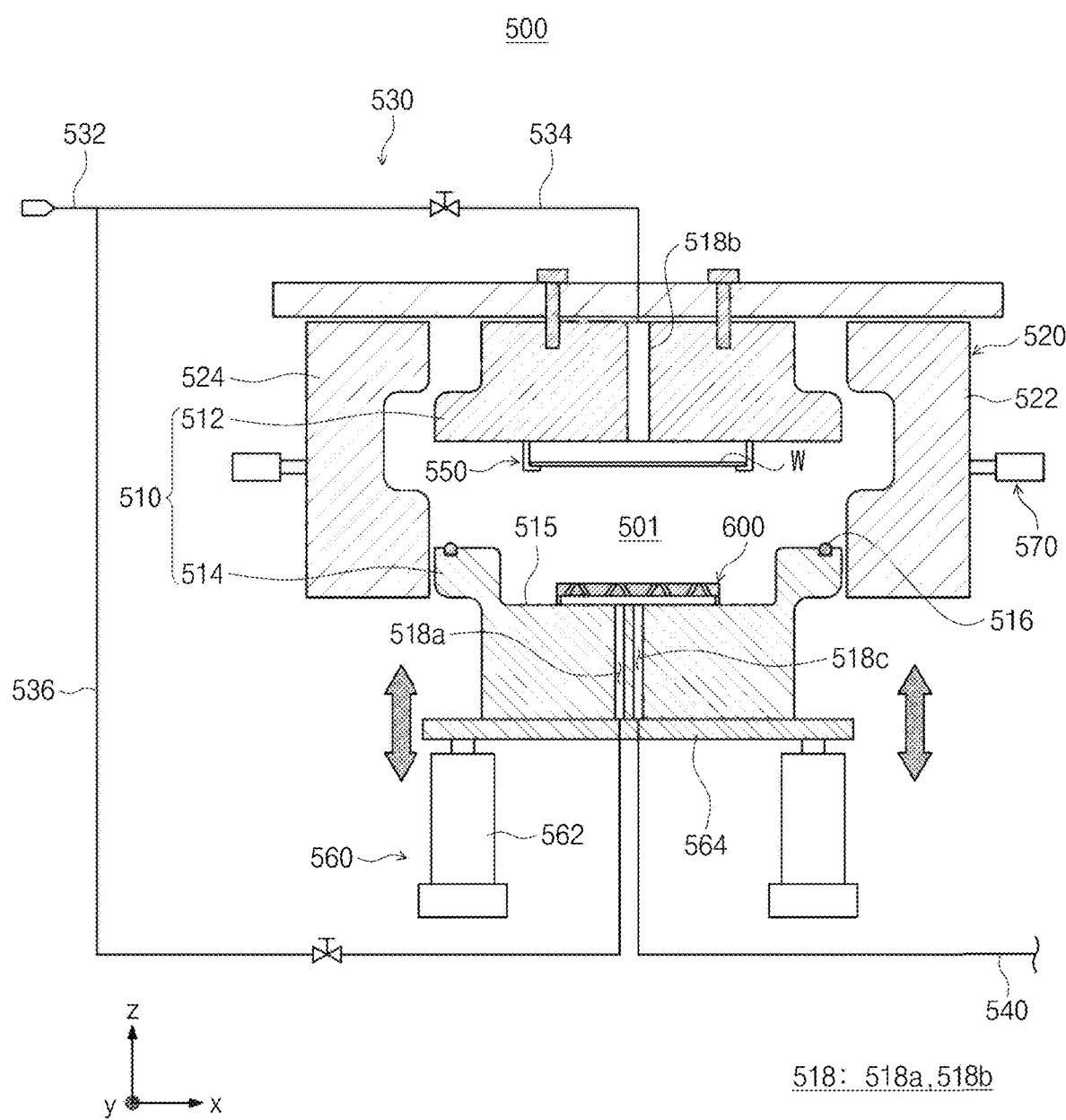
FIG. 3 is a diagram schematically illustrating a drying chamber of FIG. 1 according to the exemplary embodiment.
Figure 4:
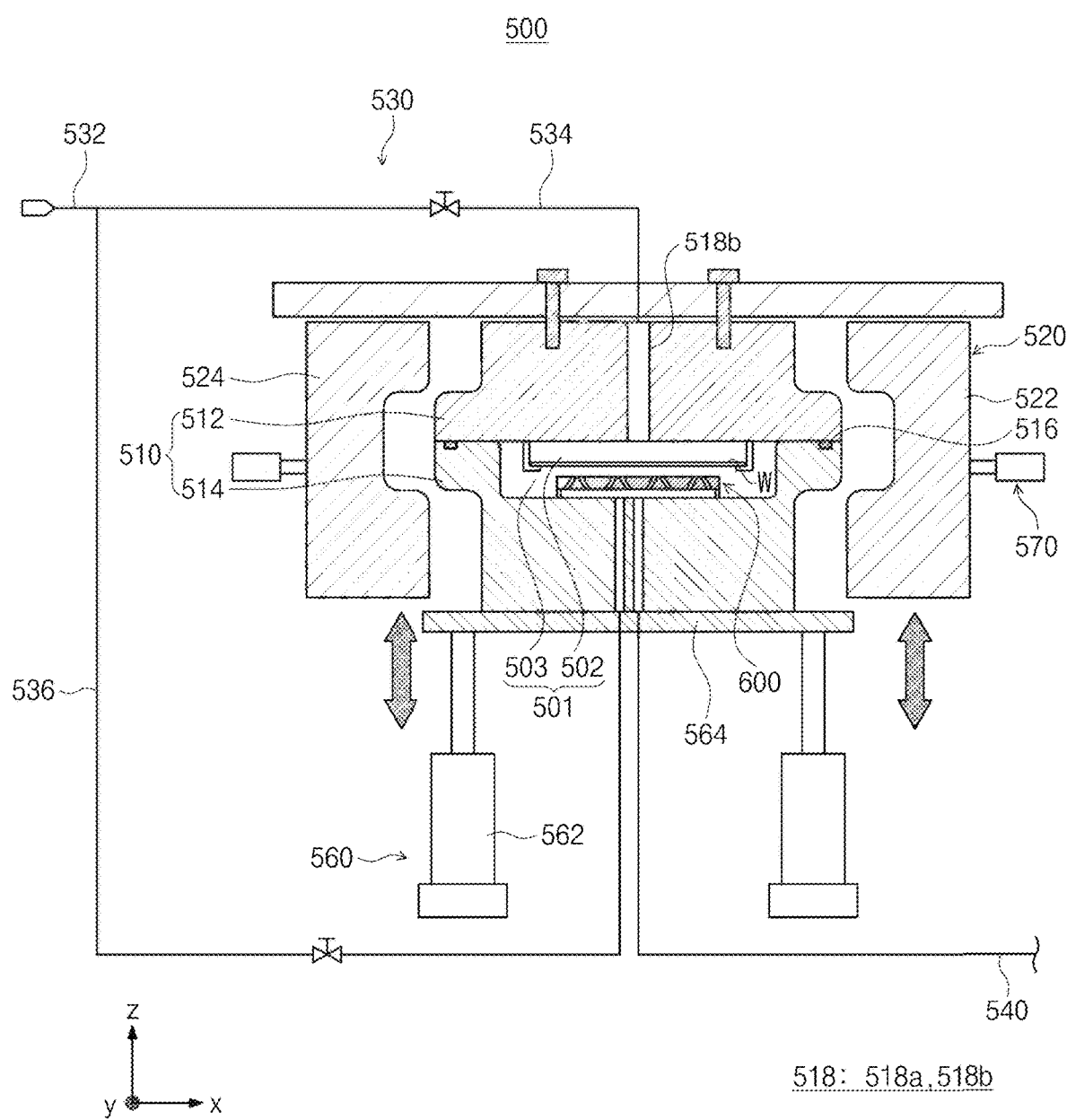
FIG. 4 is a diagram illustrating an upper body and a lower body of FIG. 3 located in a closed position.
Figure 5:
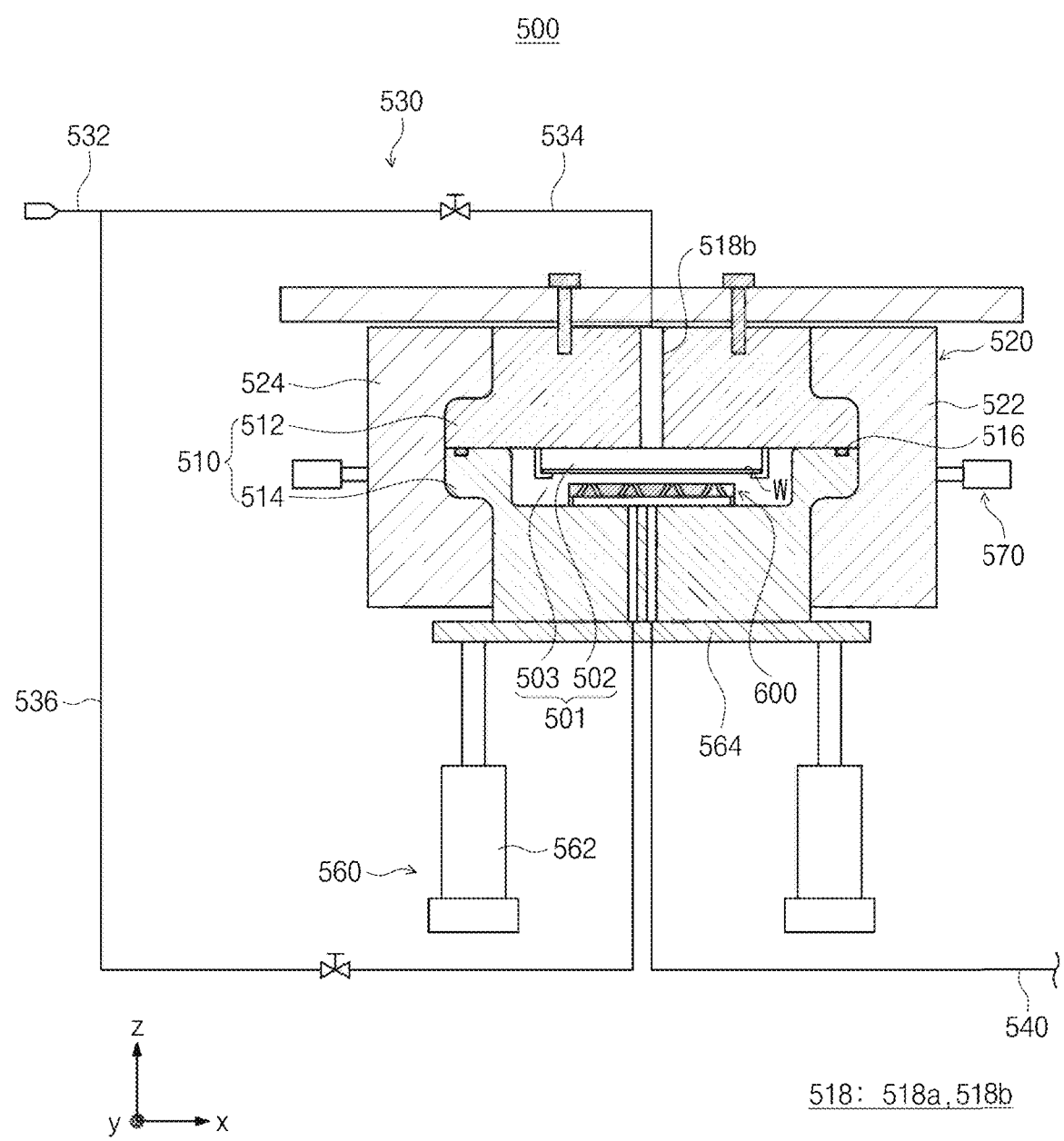
FIG. 5 is a diagram illustrating a first clamping body and a second clamping body of FIG. 3 located in a clamping position.

FIG. 3 is a diagram schematically illustrating the drying chamber of FIG. 1 according to the exemplary embodiment, FIG. 4 is a diagram illustrating an upper body and a lower body of FIG. 3 located in a closed position, and FIG. 5 is a diagram illustrating a first clamping body and a second clamping body of FIG. 3 located in a clamping position.

Referring to FIGS. 3 to 5, the drying chamber 500 according to the exemplary embodiment of the present invention may remove any residual treatment solution on the substrate W by using a drying fluid in a supercritical state. For example, the drying chamber 500 may perform a drying process to remove the organic solvent remaining on the substrate W by using carbon dioxide ($CO_2$) in a supercritical state. For example, the supercritical process may include a cleaning process using a supercritical fluid, a drying process, an etching process, or the like. The supercritical fluid may be a substance at a temperature and pressure equal to or greater than a critical point that has diffusivity, viscosity, and surface tension like gas and solubility like a liquid. For example, the supercritical fluid may include carbon dioxide ($CO_2$), water ($H_2O$), methane ($CH_4$), ethane ($C_2H_6$), propane ($C_3H_8$), ethylene ($C_2H_4$), propylene ($C_3H_6$), methanol ($CH_3OH$), ethanol ($C_2H_5OH$), sulfur hexafluoride ($SF_6$), acetone ($C_3H_6O$), and the like.

The drying chamber 500 may include a chamber body 510, a clamping body 520, a fluid supply unit 530, a fluid exhaust line 540, a support member 550, a first movement unit 560, a second movement unit 570, and a filler member 600. The chamber body 510 and the clamping body 520 may be referred to collectively as a body.

The chamber body 510 may include an upper body 512 and a lower body 514. The upper body 512 and the lower body 514 may be combined with each other to form a treatment space 501. The treatment space 501 may include an upper space 502 corresponding to an upper portion and a lower space 503 corresponding to a lower portion relative to the substrate placed on the support member. The upper body 512 may include a bottom surface 513. The bottom surface 513 of the upper body 512 may be provided as an upper wall of the chamber body 510. The lower body 514 may include a top surface 515. The top surface 515 of the lower body 514 may be provided as a lower wall of the chamber body 110.

Any one of the upper body 512 and the lower body 514 may be configured to be movable relative to the other. For example, any one of the upper body 512 and the lower body 514 may be moved by the first movement unit 560. The first movement unit 560 may include a lifting driver 562 and a lifting plate 564. The lifting drivers 562 may be provided in plurality and may be coupled to the lifting plate 564. The lifting plate 564 may be coupled to the lower body 514. When the lifting driver 562 lifts the elevation plate 564, the lower body 514 may be lifted along with the lifting plate 564. A heater for heating the drying fluid supplied to the treatment space 512 may be buried in the chamber body 510. Further, to increase the airtightness of the treatment space 501 when the upper body 512 and the lower body 514 are in the closed position, a groove may be formed in the lower body 514, and an O-ring 516 that is a sealing member may be inserted into the groove.

The position of the upper body 512 is fixed, and the lower body 514 may be lifted along the third direction Z by the first movement unit 560. Hereinafter, the position in which the lower body 514 is raised and in contact with the upper body 512 to form the treatment space 501 is referred to as the closed position, and the position in which the lower body 514 is lowered and spaced apart from the upper body 512 is referred to as the open position.

The clamping body 520 may include a first clamping body 522 and a second clamping body 524. The first clamping body 522 and the second clamping body 524 may clamp the chamber body 510 in opposite positions. The inner surface of the first clamping body 522 and the second clamping body 524 may have a shape substantially corresponding to the outer surface of the chamber body 510 located in the closed position. The first clamping body 522 and the second clamping body 524 may be moved by the second movement unit 570. The second movement unit 570 may be provided in plurality.

The support member 550 may support the substrate W in the treatment space 501. The support member 550 may support an edge region of the substrate W in the treatment space 501. The support member 550 may support the underside of the edge region of the substrate W. The support member 550 may be installed on the upper body 512.

The supply port 518 may supply a supercritical fluid to the interior of the chamber body 510. The supply port 518 may include a first supply port 518a and a second supply port 518b.

The first supply port 518a may be provided in a center region of the lower wall of the lower body 514. In the exemplary embodiment, the first supply port 518a may be provided at a location that is biased a predetermined distance from the center of the lower wall. In the exemplary embodiment, the center of the lower wall may be at a position corresponding to a center of the substrate W on a perpendicular line to the center of the substrate W when the substrate W is supported on the support member 550. The first supply port 518a supplies the supercritical fluid to the lower space 503 located below the substrate W in the treatment space 501.

The second supply port 518b is provided in a center region of the upper wall of the upper body 512. The second supply port 518b supplies the supercritical fluid to the upper space 502 located above the substrate W in the treatment space 501. The supercritical fluid supplied from the second supply port 518b may be provided to the top surface of the substrate W.

The exhaust port 518c exhausts the fluid residing inside the chamber body 510 to the outside. The exhaust port 518c is provided in the lower wall of the lower body. The exhaust port 518c may be located adjacent to the first supply port 518a. The exhaust port 518c may be provided in the center region of the lower wall on the lower body. The diameter of the exhaust port 518c may be provided smaller than the diameter of the first supply port 518a. The fluid exhausted from the exhaust port 518c may include a supercritical fluid in which an organic solvent is dissolved. The fluid exhausted from the exhaust port 518c may be directed to a regeneration device (not illustrated). In the regeneration device, the fluid may be separated into the supercritical fluid and the organic solvent. In contrast, the fluid exhausted from the exhaust port 518c may be released to the atmosphere via an exhaust line 519.

The fluid supply unit 530 supplies a process fluid to the treatment space 501 of the chamber body 510. In one example, the process fluid may be supplied to the treatment space 501 in a supercritical state. Alternatively, the process fluid may be supplied to the treatment space 501 in a gaseous state and phase-changed to the supercritical state within the treatment space 501. In one example, the fluid supply unit 530 may include a main supply line 532, an upper branch line 534, and a lower branch line 536. The upper branch line 534 and the lower branch line 536 branch from the main supply line 532. The upper branch line 534 is coupled to the second supply port 518b to supply the process fluid from the top of the substrate W placed on the support member 550. The lower branch line 536 is coupled to the first supply port 518a to supply the process fluid from the portion below the substrate W placed on the support member 550. The fluid exhaust line 540 is coupled to the exhaust port 518c. The supercritical fluid in the treatment space 501 of the chamber body 510 is exhausted to the outside through the fluid exhaust line 540. The fluid exhaust line 540 may be coupled to a pressure reducing member (not illustrated) that provides decompression to the treatment space. The pressure reducing member may be a pump. However, without limitation, the pressure reducing member may be any known device capable of providing decompression to the treatment space.

The filler member 600 is located under the support member 550. The filler member 600 includes a plate 610. The filler member 600 may block the supercritical fluid supplied from the first supply port 518a from being sprayed directly onto the rear surface of the substrate W. Further, the volume of the treatment space 501 may be reduced by the filler member 600. Furthermore, the filler member 600 may induce collisions of the treatment fluid supplied to the treatment space to increase the turbulence intensity of the treatment fluid.

Thus, the filler member 600 may reduce the amount of supercritical fluid used in the drying process and reduce the process time, while maintaining process performance.

Figure 6:
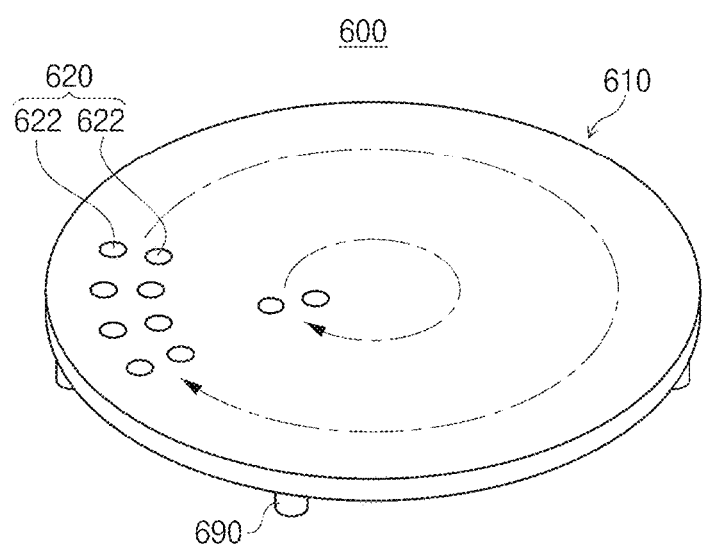
FIG. 6 is a top plan view illustrating a filler member provided in a supercritical treating apparatus according to a first exemplary embodiment.
Figure 7A:
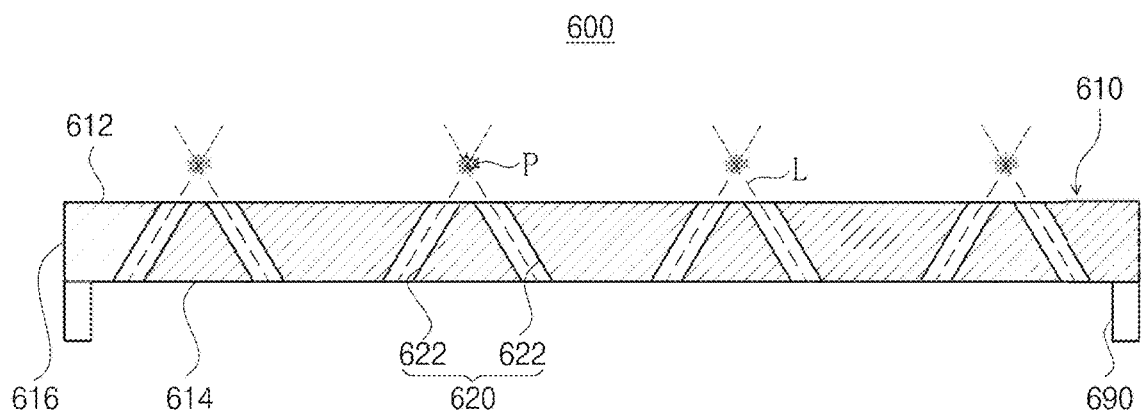
FIG. 7A is a cross-sectional view of the filler member illustrated in FIG. 6.

FIG. 6 is a top plan view illustrating a filler member provided in a supercritical treating apparatus according to a first exemplary embodiment, and FIG. 7A is a cross-sectional view of the filler member illustrated in FIG. 6.

Referring to FIG. 5 with further reference to FIGS. 6 and 7A, the filler member 600 will be described.

The plate 610 may be provided in the shape of a plate having a predetermined thickness. The plate 610 may be in a form with a filled inside. The plate 610 may have a top surface 612, a bottom surface 614, and a lateral surface 616. The top surface 612 may be disposed side by side the bottom surface 614 while facing the bottom surface 614. With the interior of the chamber body 510 sealed, the top surface 612 of the plate 610 may maintain a predetermined spacing from the bottom surface of the substrate W. The bottom surface 614 of the plate 610 may be disposed to face the bottom surface 515 of the chamber body 510. The bottom surface 614 is spaced apart from the bottom surface 515 of the chamber body 510 by a predetermined distance.

The plate is supported by the support rod 690. A plurality of support rods 690 may be provided, and may be spaced apart from each other. An upper end of the support rod 690 is coupled to the plate 610, and a lower end is supported on the bottom surface 515 of the chamber body 510.

The plate 610 has a perforation group 620. The perforation group 620 may include at least two perforations 622. The perforations 622 of the perforation group 620 may be provided in a collision configuration such that treatment fluids passing through the perforations collide each other.

The perforations 622 of the perforation group 620 may be provided to have collision points P where the discharge paths L of the treatment fluids intersect. At least one of the perforations 622 configuring the perforation group 620 may be provided to be inclined.

As illustrated in FIGS. 6 and 7a, the perforation group 620 may include a double-collision structure including two inclined perforations 622. The collision point P of the perforation group 620 may be spaced a predetermined distance from the top surface of the plate 610 and spaced from the bottom surface of the substrate.

Figure 7B:
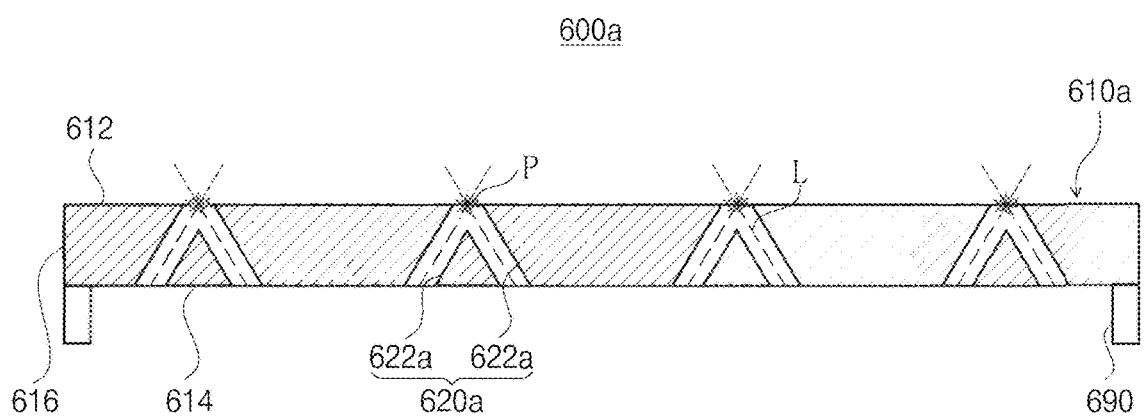
FIG. 7b is a cross-sectional view illustrating a modified example of the filler member.

FIG. 7b is a cross-sectional view illustrating a modified example of the filler member.

As illustrated in FIG. 7B, the perforation group 620a of the filler member 600a according to the modified example may be provided with two inclined perforations 622 intersecting each other on the top surface of the plate 610, and the collision point P of the perforation group 620a having the structure may be the top surface of the plate 610a.

Figure 8A:
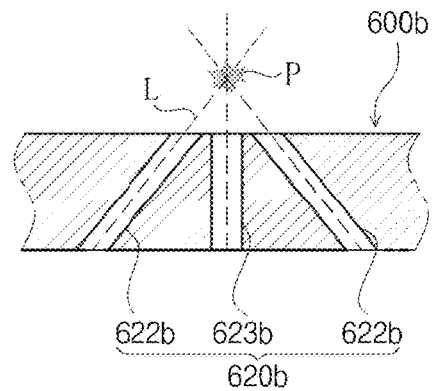
FIGS. 8A and 8B are diagrams illustrating other examples of a perforation group.
Figure 8B:
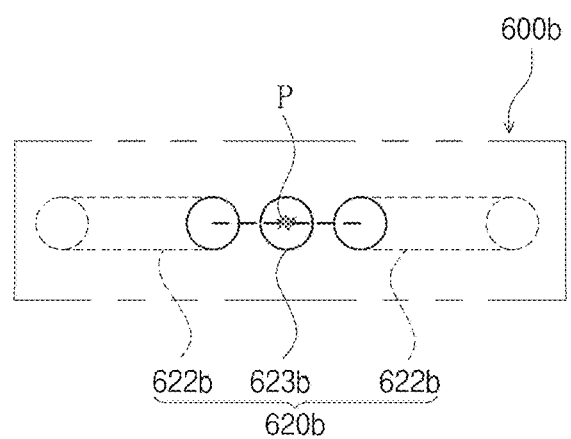

FIGS. 8A and 8B are diagrams illustrating other examples of the perforation group.

As illustrated in FIGS. 8A and 8B, a filler member 600B may include a triple collision structure in which a perforation group 620B of a plate 610B includes three perforations 622B and 623B, with two inclined perforations 622B and one perpendicular perforation 623B. The three perforations 622b and 623b may be disposed in a straight line.

Figure 9:
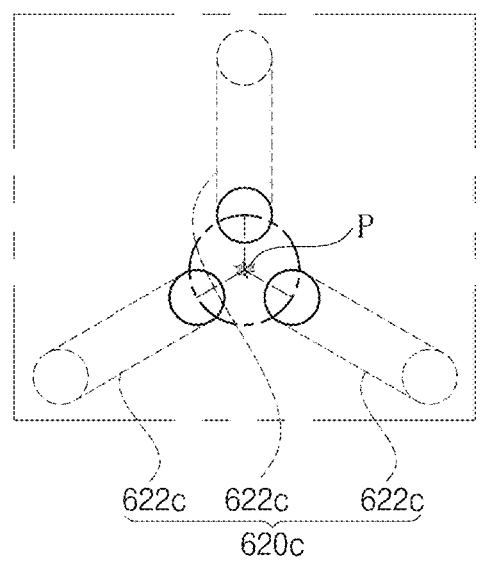
FIG. 9 is a diagram illustrating a modified example of a perforation group.

In another example, as illustrated in FIG. 9, the perforations 622c of the perforation group 620c of the triple collision structure are disposed at the same radius and may include inclined perforations 622c.

While the present exemplary embodiment is illustrated and described as having two or three perforations in a perforation group, the number of perforations in the perforation group is not limited.

Figure 10:
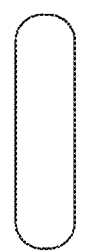
FIG. 10 is a diagram illustrating various cross-sections of a perforation.
Figure 10:
Figure 10:
Figure 10:
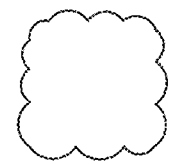

FIG. 10 is a diagram illustrating various cross-sections of a perforation.

As illustrated in FIG. 10, the cross-section of the perforation may be provided in various shapes, such as an oval shape (A), square shapes (B) and (C), and an irregular circular shape (D), other than circular.

Figure 11:
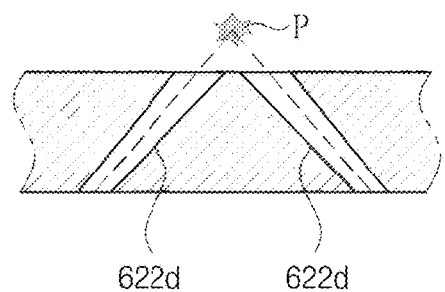
FIG. 11 is a diagram illustrating a modified example of a perforation.

Furthermore, the perforation may be provided with different cross-sectional areas at an inlet and an outlet. For example, as illustrated in FIG. 11, the perforation may have a funnel shape with a narrow inlet and a widening outlet, and the supercritical fluid passing through the perforation has a slower flow velocity to be expected desired turbulence intensity.

Figure 12:
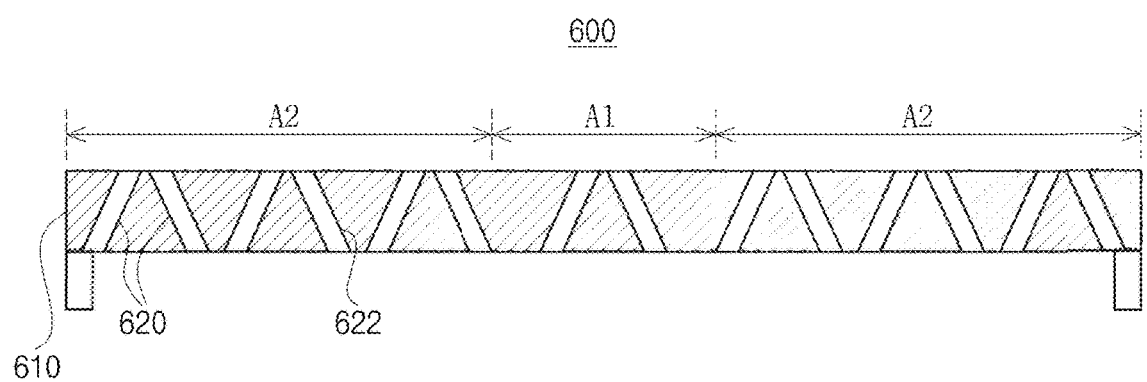
FIG. 12 is a diagram illustrating a disposition structure of the perforation group in the filler member.

As illustrated in FIG. 12, the filler member 600 may be provided with a center region A1 of the plate 610 and in an edge region A2 surrounding the center region A1 with different disposition density of perforation groups 620. FIG. 12 illustrates that the disposition density of the perforation groups 620 in the edge region A2 is relatively higher than in the center region A1, but the present invention is not limited thereto, and depending on process characteristics, the disposition density of the perforation groups in the center region may be relatively higher than in the edge region.

Figure 13:
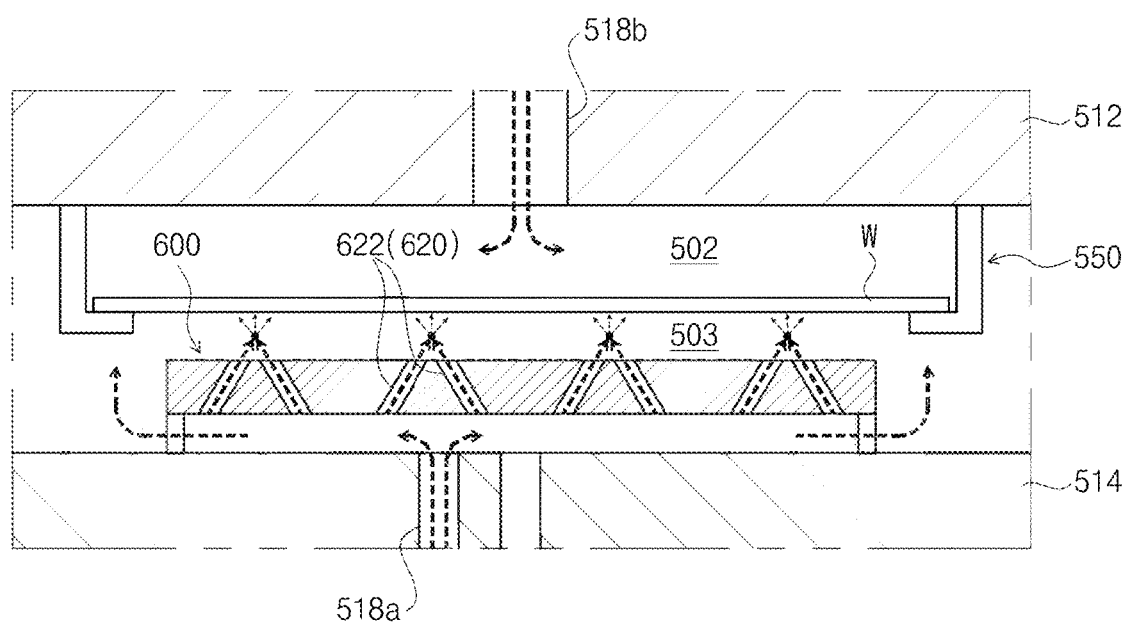
FIG. 13 is a diagram illustrating a flow of a supercritical fluid.

FIG. 13 is a diagram illustrating a flow of a supercritical fluid.

As illustrated in FIG. 13, a portion of the supercritical fluid supplied through the first supply port 518a travels to both sides along the edge of the filler member and then flows to the underside of the substrate, and another portion flows through the perforations of the perforation groups and then collides at the collision point and flows to the underside of the substrate after collision. At this time, the supercritical fluid has a higher turbulence intensity through the collision, and the substitution efficiency with the fluid on the substrate is higher.

Figure 14:
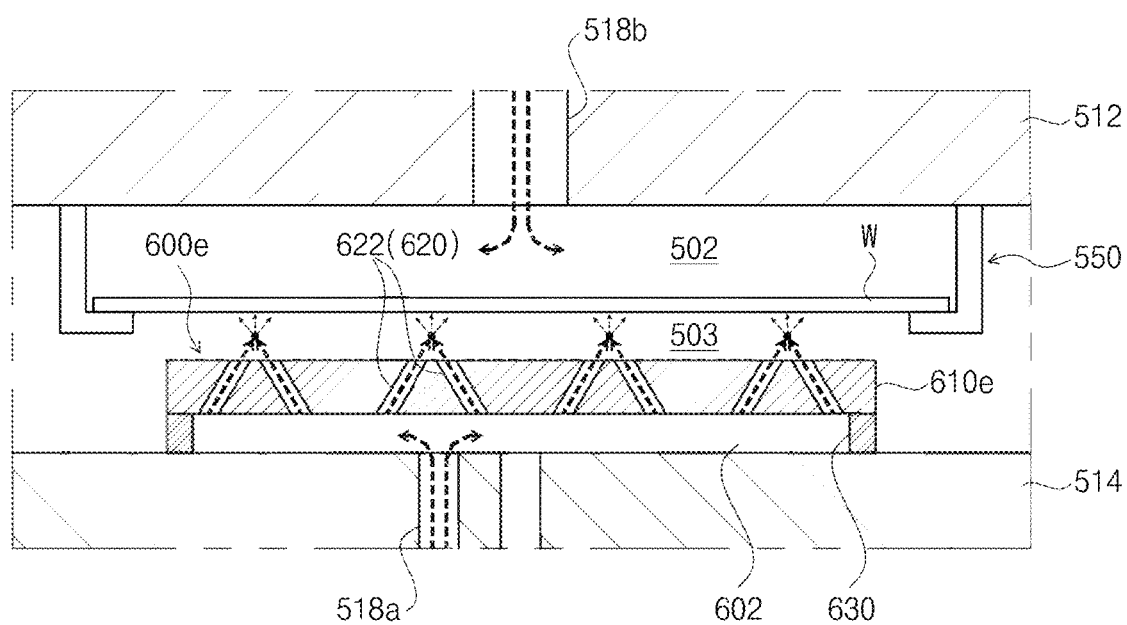
FIG. 14 is a diagram illustrating another example of the filler member.

FIG. 14 is a diagram illustrating another example of the filler member.

As illustrated in FIG. 14, a filler member 600e may include a plate 610e and a lateral wall part 630. Here, the plate 610e has substantially the same configuration as the plate 610 illustrated in FIG. 6 and will not be described in detail. The lateral wall part 630 provides a buffer space 602 between the first supply port 518a and the plate 610e that is compartmentalized from a treatment space 501. Thus, supercritical fluid supplied through the first supply port 518a may only be supplied to the lower space 503 through the perforation groups 620 of the plate 610e after staying in the buffer space 602.

Figure 15:
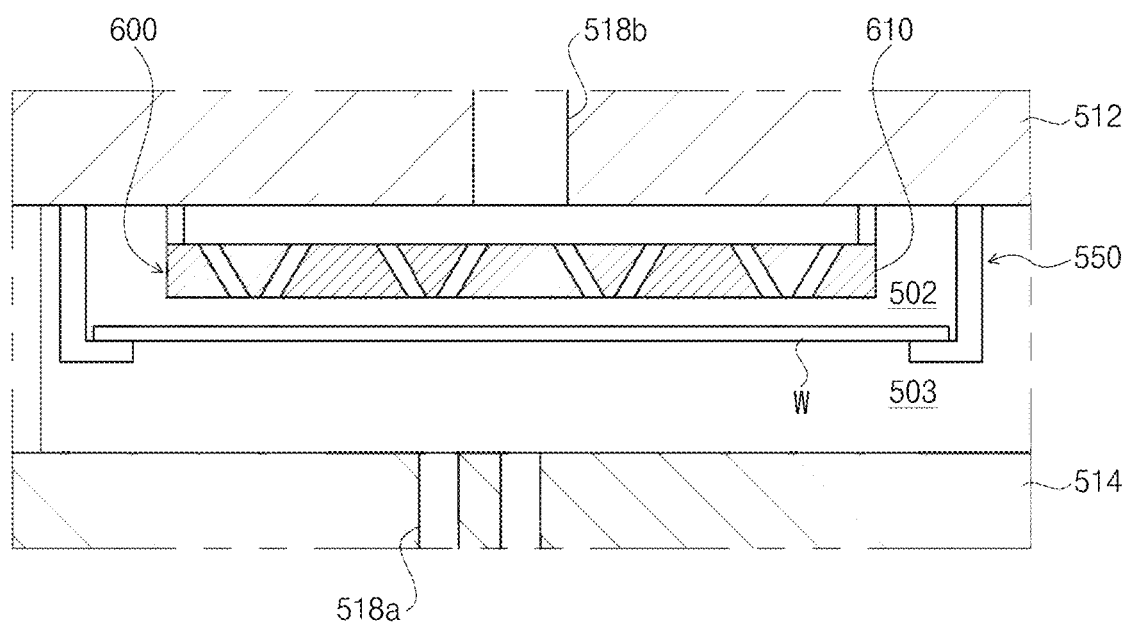
FIG. 15 is a diagram illustrating the filler member installed in an upper space.

In the meantime, these filler member 600 may be disposed opposite the substrate W in the upper space 502 between the upper supply port 518b and the substrate W, as illustrated in FIG. 15.

The foregoing detailed description illustrates the present invention. Further, the above content shows and describes the exemplary embodiment of the present invention, and the present invention may be used in various other combinations, modifications, and environments. That is, the foregoing content may be modified or corrected within the scope of the concept of the invention disclosed in the present specification, the scope equivalent to that of the invention, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating apparatus comprising:
a chamber providing a treatment space therein;
a substrate support member located inside the chamber and for supporting a substrate;
an upper supply port provided on a top wall of the chamber and supplying a treatment fluid into the treatment space of the chamber;
a lower supply port provided on a bottom wall of the chamber and supplying a treatment fluid into the treatment space; and
a filler member located between the lower supply port and the substrate supported by the substrate support member,
the filler member including a plate with a plurality of perforations and a plurality of support rods located below the plate,
wherein, when viewed from above, the plurality of the support rods surround the lower supply port, and support the plate,
a portion of the treatment fluid supplied through the lower supply port is-being supplied to the substrate through the plurality of perforations formed in the plate, and another portion of the treatment fluid is supplied to the substrate through a space formed between adjacent rods of the plurality of the support rods,
the plurality of perforations being in a collision shape such that streams of the treatment fluid passing through the plurality of perforations collide with each other.

2. The substrate treating apparatus of claim 1, wherein the perforations are in one or more plurality of perforation groups, and
the respective perforation of each of the one or more groups having collision points where discharge paths of the treatment fluid intersect.

3. The substrate treating apparatus of claim 2, wherein at least one of the plurality of perforations is inclined.

4. The substrate treating apparatus of claim 2, wherein the respective perforations of each of the one or more plurality of perforation groups are disposed in a straight line.

5. The substrate treating apparatus of claim 2, wherein each of the one or more plurality of perforation groups collide with each other, and each of the one or more plurality of perforation groups having respective perforations, of the plurality of perforations, are at select radii on the plate with a remainder of the plate being devoid of perforations.

6. The substrate treating apparatus of claim 2, wherein each of the plurality of perforations have a cross-section in any one of a circular shape, an oval shape, a square shape, and an irregular circular shape.

7. The substrate treating apparatus of claim 2, wherein the plate is provided with a central region and an edge region surrounding the central region, and the central region has a first set of the plurality of perforations that have a different density relative a second set of the plurality of perforations of the edge region.

8. The substrate treating apparatus of claim 2, wherein the filler member provides a buffer space compartmentalized from the treatment space between a respective one of the supply ports and the plate, and
the treatment fluid supplied through the respective one of the supply ports stays in the buffer space and is then supplied to the treatment space through the perforation groups in the plate.

9. The substrate treating apparatus of claim 1, wherein the treatment fluid is a supercritical fluid.

10. A substrate treating apparatus comprising:
a chamber providing a treatment space therein;
a substrate support member located inside the chamber and for supporting a substrate;
an upper supply port provided on a top wall of the chamber and supplying a supercritical fluid into the treatment space of the chamber;
a lower supply port provided on a bottom wall of the chamber and supplying the supercritical fluid into the treatment space of the chamber; and
a filler member located between the lower supply port and the substrate supported by the substrate support member, and below the substrate,
the filler member including
a plate with a plurality of perforations; and
a plurality of support rods located below the plate and supporting the plate;
wherein, when viewed from above, the plurality of the support rods surround the lower supply port,
a portion of the supercritical fluid supplied through the lower supply port is supplied to the substrate through the plurality of perforations formed in the plate, and another portion of the supercritical fluid is supplied to the substrate through a space formed between adjacent rods of the plurality of the support rods,
the perforations are provided to have collision points where fluid discharge paths of the perforations intersect so that the supercritical fluid passing through the perforations generates turbulence.

11. The substrate treating apparatus of claim 10, wherein at least one of the perforations is inclined, and
the perforations are disposed in a straight line or on the same radius.

12. The substrate treating apparatus of claim 10, wherein the plate is provided with a central region and an edge region surrounding the central region, the central region including a different density of the perforations relative to the edge region,
the filler member provides a buffer space compartmentalized from the treatment space between a respective one of the supply ports and the plate, and
the supercritical fluid supplied through the respective one of the supply ports stays in the buffer space and is then supplied to the treatment space through the perforations groups in the plate.

* * * * *